(12) United States Patent  (10) Patent No.: US 9,060,425 B2
Yin et al.  (45) Date of Patent: Jun. 16, 2015

(54) ELECTRONIC DEVICE ENCLOSURE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Xiao-Gang Yin, Shenzhen (CN); Li-Ren Fu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 254 days.

(21) Appl. No.: 13/854,144

(22) Filed: Apr. 1, 2013

(65) Prior Publication Data

US 2014/0268567 A1    Sep. 18, 2014

(51) Int. Cl.
*H05K 5/00* (2006.01)
*H05K 5/02* (2006.01)

(52) U.S. Cl.
CPC ............ *H05K 5/0221* (2013.01); *H05K 5/0213* (2013.01)

(58) Field of Classification Search
USPC .......... 361/679.48–679.51, 690–695, 679.43, 361/679.58
See application file for complete search history.

(56) References Cited

U.S. PATENT DOCUMENTS

| 2011/0299240 | A1* | 12/2011 | Kimura et al. | 361/679.49 |
| 2012/0008276 | A1* | 1/2012 | Cheng | 361/679.48 |
| 2013/0100600 | A1* | 4/2013 | Yin et al. | 361/679.5 |
| 2013/0114204 | A1* | 5/2013 | Nigen | 361/679.48 |
| 2013/0141865 | A1* | 6/2013 | Wu et al. | 361/679.33 |

* cited by examiner

*Primary Examiner* — Robert J Hoffberg
*Assistant Examiner* — Hung Dang
(74) *Attorney, Agent, or Firm* — Novak Druce Connolly Bove + Quigg LLP

(57) ABSTRACT

An electronic device enclosure includes a casing, an air duct mounted in the casing, and a latching member. The air duct includes a receiving bracket formed on the air duct for receiving an uninterruptible power supply module. The latching member is covered on the receiving bracket to position the uninterruptible power supply module. A first side of the latching member is rotatably connected to the receiving bracket, and a second side of the latching member is detachably latched to the receiving bracket.

20 Claims, 5 Drawing Sheets they are capable of many modifications in structure, arrangement and the like without departing from such principles. The claims that follow are those that reflect the nature of such modifications and are to include in their scope all equivalents to the claimed subject matter.

ELECTRONIC DEVICE ENCLOSURE

BACKGROUND

1. Technical Field

The disclosure relates to electronic device enclosures, and particularly to an electronic device enclosure configured for using the inner space effectively.

2. Description of Related Art

A bracket is often mounted in an electronic device enclosure to attach uninterruptible power supply modules by screwing. However, it is inconvenient to go through screwing or unscrewing to install or uninstall the uninterruptible power supply modules for maintenance or replacement.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
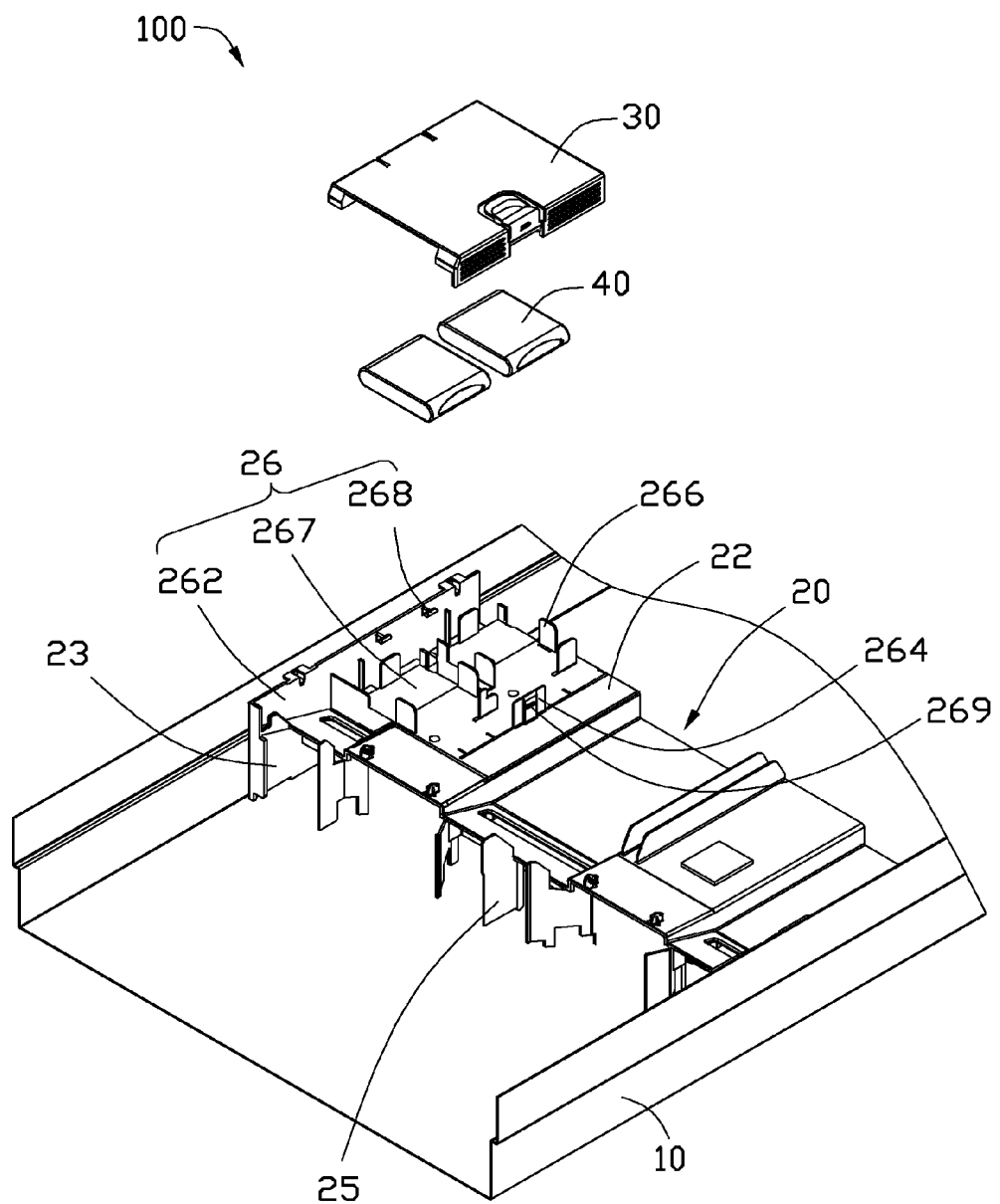
FIG. 1 is an exploded, isometric view of an embodiment of an electronic device enclosure together with two uninterruptible power supply modules, wherein the electronic device enclosure includes a latching member.

FIG. 1 shows an exemplary embodiment of an electronic device enclosure 100. The electronic device enclosure 100 includes a casing 10, an air duct 20 mounted in the casing 10 for guiding airflow, a latching member 30, and two uninterruptible power supply modules 40. In the embodiment, the electronic device enclosure 100 is a server.

The air duct 20 is substantially U-shaped, and includes a top plate 22, two end plates 23 perpendicularly extending down from opposite ends of the top plate 22, a plurality of air guiding plates 25 extending down from the top plate 22 between the end plates 23, and a receiving bracket 26 formed on the top plate 22 adjacent to one of the end plates 23. The receiving bracket 26 includes a supporting plate 262 extending up from the end plate 23, a latching plate 264 extending up from the top plate 22 and parallel to the supporting plate 262, and a plurality of position pieces 266 extending up from the top plate 22 between the supporting plate 262 and the latching plate 264. The position pieces 266 cooperatively bound two receiving spaces 267. Two opposite connecting shafts 268 protrude from the supporting plate 262 toward the latching plate 264, each connecting shaft 268 extending along a direction parallel to the supporting plate 262 and the top plate 22. The latching plate 264 defines a latching hole 269 facing the supporting plate 262.

Figure 2:
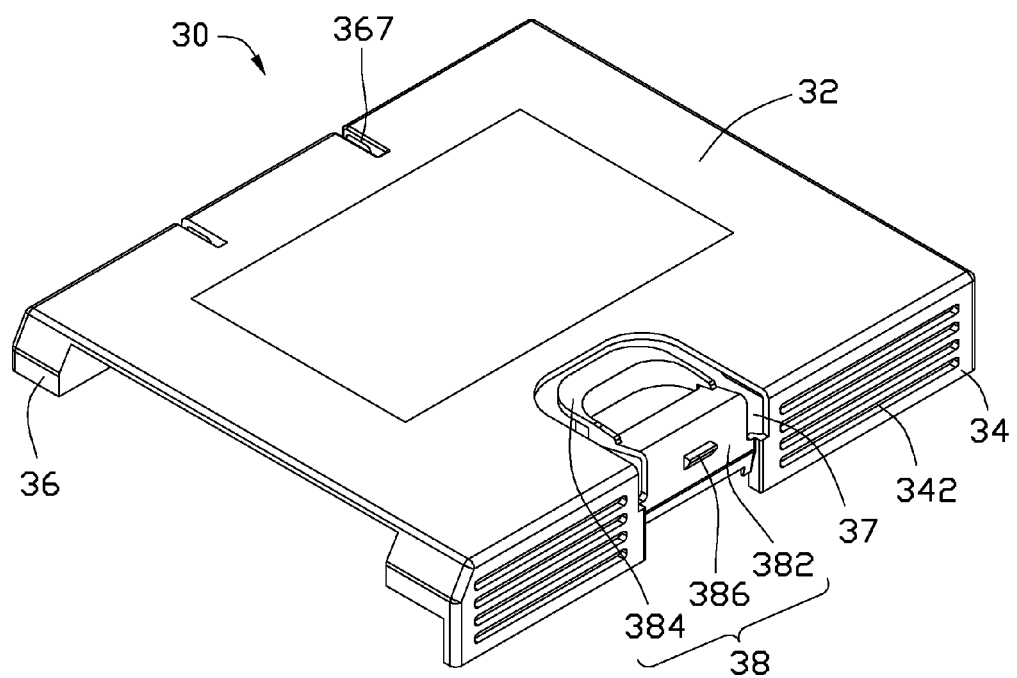
FIG. 2 is an enlarged, isometric view of the latching member of FIG. 1.
Figure 3:
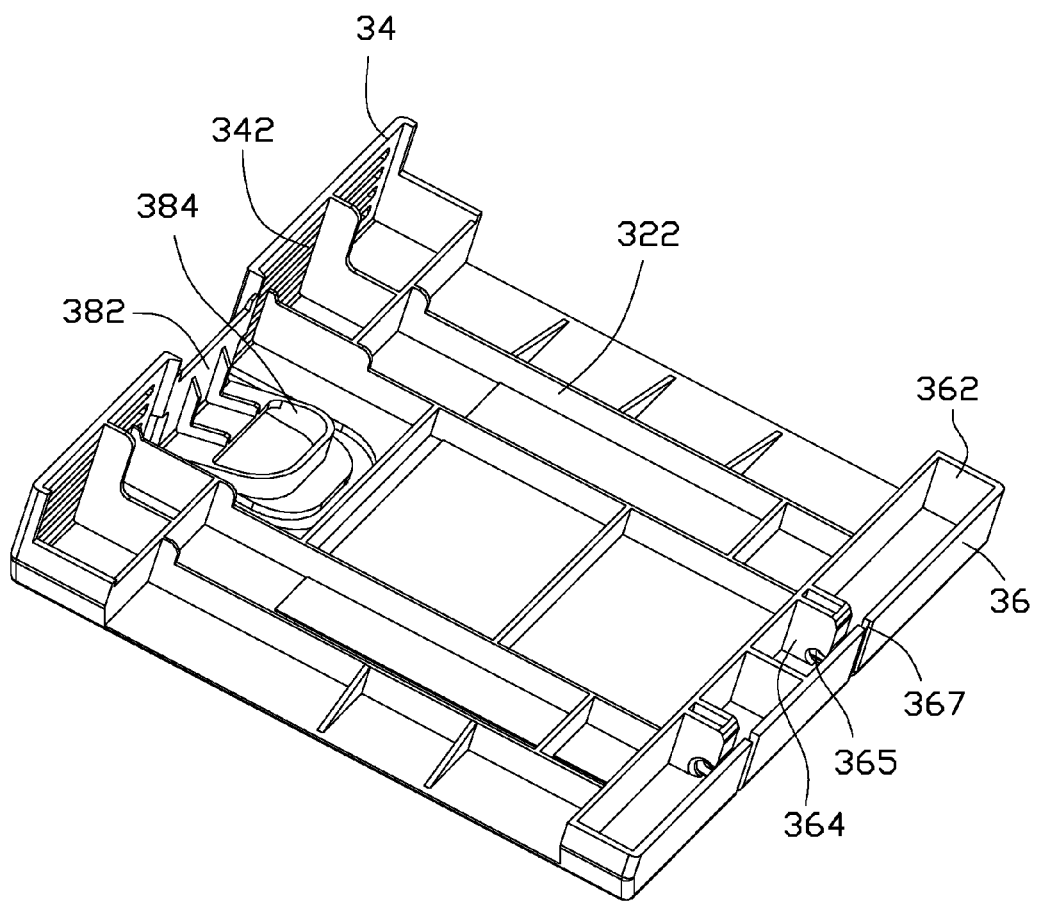
FIG. 3 is an inverted view of FIG. 2.

FIGS. 2-3 show the latching member 30 including a rectangular top board 32, a side board 34 perpendicularly extending down from a first side of the top board 32, and a rectangular connecting portion 36 perpendicularly extending down from a second side of the top board 32 opposite to the side board 34. A junction of the top board 32 and the side board 34 defines an operation opening 37. A substantially L-shaped operation portion 38 is received in the operation opening 37. The operation portion 38 includes a resilient mounting plate 382 adjacent to the side board 34, and an operation plate 384 extending in from a top of the mounting plate 382. Two ends of the bottom of the mounting plate 382 are mounted to two opposite sides of the side board 34 bounding the operation opening 37. A protrusion 386 protrudes out from a middle of the mounting plate 382. A bottom of the connecting portion 36 defines a slot 362 extending along a lengthwise direction of the connecting portion 36. Two spaced connecting blocks 364 protrude from the connecting portion 36 into the slot 362. The connecting blocks 364 define two opposite shaft holes 365 extending along a lengthwise direction of the slot 362. A junction of the top board 32 and the connecting portion 36 defines two cutouts 367 respectively communicating with the shaft holes 365. A plurality of position bars 322 protrudes down from the top board 32, between and perpendicular to the connecting portion 36 and the side board 34. The side board 34 defines a plurality of vents 342.

Figure 4:
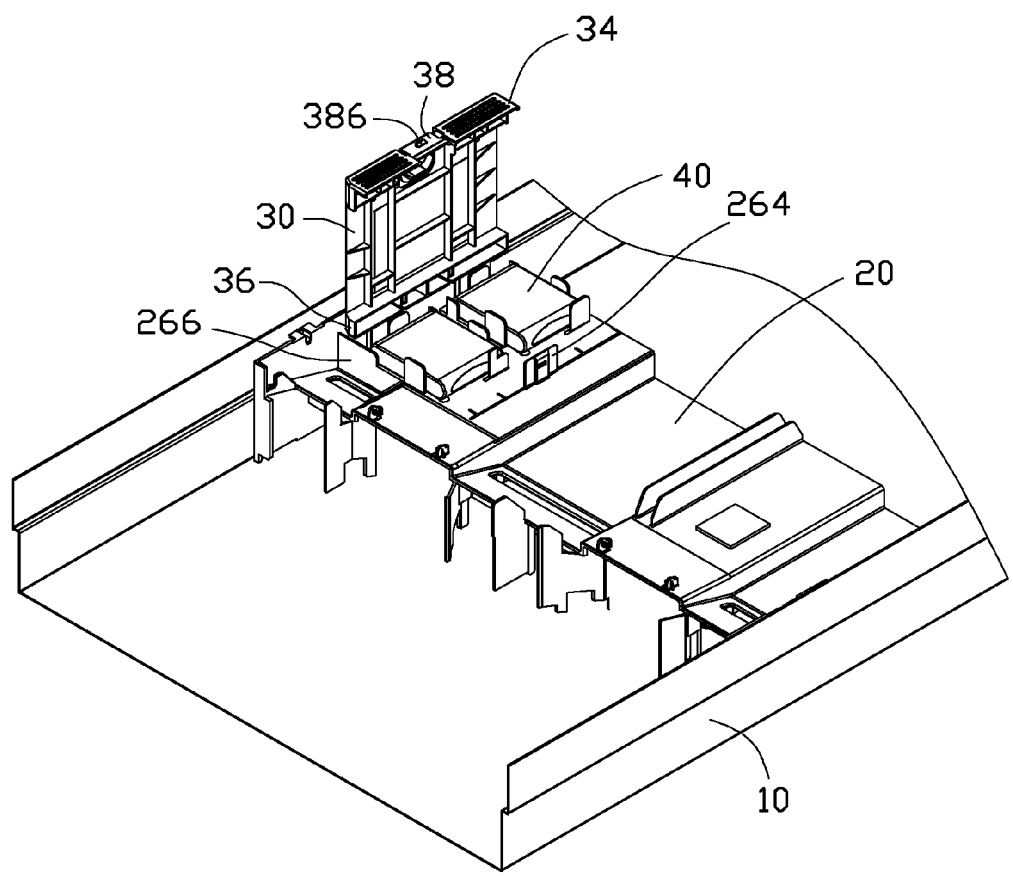
FIG. 4 is an assembled, isometric view of FIG. 1.

FIG. 4 shows that in assembly of the latching member 30 to the receiving bracket 26. The latching member 30 is located on the receiving bracket 26, with the cutouts 367 aligning with the connecting shafts 268. The connecting shafts 268 are rotatably inserted into the shaft holes 365 of the latching member 30 through the cutouts 367. Therefore, the latching member 30 is rotatably connected to the supporting plate 262.

Figure 5:
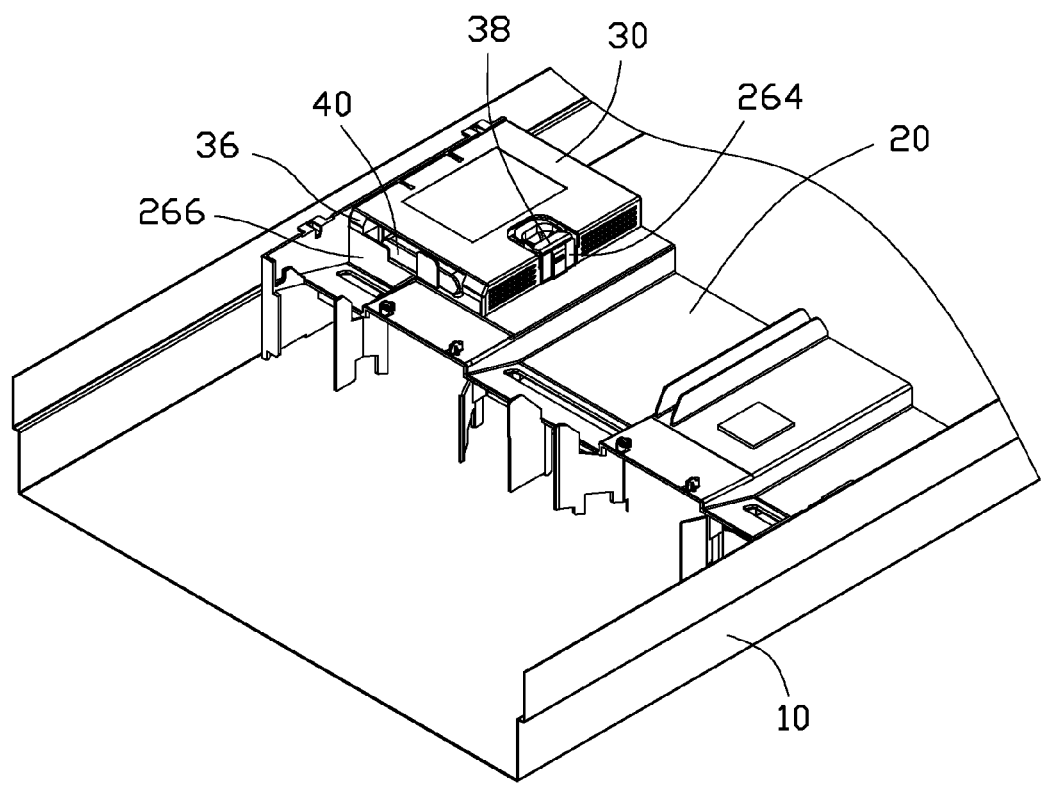
FIG. 5 is similar to FIG. 4, but shows the electronic device enclosure in use.

FIG. 5 shows that in use, the latching member 30 is rotated to allow the top board 32 to move away from the top plate 22. The uninterruptible power supply modules 40 are received in the receiving spaces 267. The latching member 30 is rotated toward the top plate 22, the protrusion 386 of the mounting plate 382 is slidably abutted against an inner surface of the latching plate 264, deforming the mounting plate 382, until the protrusion 386 aligns with the latching hole 269. The mounting plate 382 is restored to allow the protrusion 386 to be inserted into the latching hole 269. The position bars 322 of the latching member 30 abut against the uninterruptible power supply modules 40. Therefore, the uninterruptible power supply modules 40 are mounted to the air duct 20. As a result, the casing 10 is not required to provide other space to accommodate the uninterruptible power supply modules 40 and the arrangement of electronic units in the casing 10 needs no change, which saves space and cost of the casing 10.

The air duct 20 is mounted in the casing 10, together with the uninterruptible power supply modules 40. Some airflow can pass through the vents 34 of the latching member 30 to dissipate the heat from the uninterruptible power supply modules 40.

To detach the uninterruptible power supply modules 40 from the air duct 20, the operation plate 384 is pushed down, deforming the mounting plate 382 away from the latching plate 264, until the protrusion 386 is disengaged from the latching hole 269 of the latching plate 264. The latching member 30 is rotated away from the top plate 22, the position bars 322 are disengaged from the uninterruptible power supply modules 40. Therefore, the uninterruptible power supply modules 40 can be easily detached from the mounting apparatus 100.

It is believed that the present embodiment and its advantages will be understood from the foregoing description, and it will be apparent that various changes may be made thereto without departing from the spirit and scope of the description or sacrificing all of their material advantages, the example hereinbefore described merely being exemplary embodiment.

What is claimed is:

1. An electronic device enclosure, comprising:
   a casing;
   an air duct mounted in the casing;
   a receiving bracket formed on the air duct for receiving an uninterruptible power supply module; and
   a latching member covering the receiving bracket to position the uninterruptible power supply module;
   wherein a first side of the latching member is rotatably connected to the receiving bracket, and a second side of the latching member is detachably latched to the receiving bracket.

2. The electronic device enclosure of claim 1, wherein the air duct further comprises a top plate and an end plate extending down from an end of the top plate, the receiving bracket is formed on the top plate adjacent to the end plate.

3. The electronic device enclosure of claim 2, wherein the receiving bracket comprises a supporting plate extending up from the end plate, and a latching plate extending up from the top plate and parallel to the supporting plate, the first side of the latching member is rotatably connected to the supporting plate, and the second side of the latching member is detachably mounted to the latching plate.

4. The electronic device enclosure of claim 3, wherein the receiving bracket further comprises a plurality of position pieces extending up from the top plate between the supporting plate and the latching plate, the plurality of position pieces cooperatively bounds a receiving space for receiving the uninterruptible power supply module.

5. The electronic device enclosure of claim 4, wherein the latching member comprises a top board, a side board extending down from a first side of the top board, and a connecting portion extending down from a second side of the top board opposite to the side board, the connecting portion is rotatably connected to the supporting plate, the side board is detachably mounted to the latching plate.

6. The electronic device enclosure of claim 5, wherein a junction of the top board and the side board defines an operation opening, an operation portion is formed in the operation opening, the latching plate defines a latching hole, a protrusion protrudes from the operation portion for latching in the latching hole of the latching plate.

7. The electronic device enclosure of claim 6, wherein the operation portion comprise a resilient mounting plate adjacent to the side board and an operation plate extending in from a top of the mounting plate, two ends of the mounting plate are connected to two sides of the side board bounding the operation opening, the protrusion is formed on the mounting plate.

8. The electronic device enclosure of claim 6, wherein the side board defines a plurality of vents.

9. The electronic device enclosure of claim 5, wherein a bottom of the connecting portion defines a slot extending along a lengthwise direction of the connecting portion, a connecting block protrudes from the connecting portion into the slot, the connecting block defines a shaft hole extending along a lengthwise direction of the slot, a connecting shaft protrudes from the supporting plate and is rotatably received in the shaft hole.

10. The electronic device enclosure of claim 5, wherein a plurality of position bars protrudes down from the top board between the connecting portion and the side board for abutting against the uninterruptible power supply module.

11. An assembly, comprising:
    a casing;
    an air duct mounted in the casing;
    a receiving bracket formed on the air duct;
    an uninterruptible power supply module received in the receiving bracket; and
    a latching member covered on the receiving bracket to position the uninterruptible power supply module;
    wherein a first side of the latching member is rotatably connected to the receiving bracket, and a second side of the latching member is detachably latched to the receiving bracket.

12. The assembly of claim 11, wherein the air duct further comprises a top plate and an end plate extending down from an end of the top plate, the receiving bracket is formed on the top plate adjacent to the end plate.

13. The assembly of claim 12, wherein the receiving bracket comprises a supporting plate extending up from the end plate, and a latching plate extending up from the top plate and parallel to the supporting plate, the first side of the latching member is rotatably connected to the supporting plate, and the second side of the latching member is detachably mounted to the latching plate.

14. The assembly of claim 13, wherein the receiving bracket further comprises a plurality of position pieces extending up from the top plate between the supporting plate and the latching plate, the plurality of position pieces cooperatively bounds a receiving space for receiving the uninterruptible power supply module.

15. The assembly of claim 14, wherein the latching member comprises a top board, a side board extending down from a first side of the top board, and a connecting portion extending down from a second side of the top board opposite to the side board, the connecting portion is rotatably connected to the supporting plate, the side board is detachably mounted to the latching plate.

16. The assembly of claim 15, wherein a junction of the top board and the side board defines an operation opening, an operation portion is formed in the operation opening, the latching plate defines a latching hole, a protrusion protrudes from the operation portion for latching in the latching hole of the latching plate.

17. The assembly of claim 16, wherein the operation portion comprise a resilient mounting plate adjacent to the side board and an operation plate extending in from a top of the mounting plate, two ends of the mounting plate are connected to two sides of the side board bounding the operation opening, the protrusion is formed on the mounting plate.

18. The assembly of claim 16, wherein the side board defines a plurality of vents.

19. The assembly of claim 15, wherein a bottom of the connecting portion defines a slot extending along a lengthwise direction of the connecting portion, a connecting block protrudes from the connecting portion into the slot, the connecting block defines a shaft hole extending along a lengthwise direction of the slot, a connecting shaft protrudes from the supporting plate and is rotatably received in the shaft hole.

20. The assembly of claim 15, wherein a plurality of position bars protrudes down from the top board between the connecting portion and the side board for abutting against the uninterruptible power supply module.

* * * * *